United States Patent
Höppel

(10) Patent No.: US 10,784,408 B2
(45) Date of Patent: Sep. 22, 2020

(54) OPTOELECTRONIC SEMICONDUCTOR CHIP AND METHOD OF PRODUCING AN OPTOELECTRONIC SEMICONDUCTOR CHIP

(71) Applicant: OSRAM OLED GmbH, Regensburg (DE)

(72) Inventor: Lutz Höppel, Alteglofsheim (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/092,507

(22) PCT Filed: Apr. 10, 2017

(86) PCT No.: PCT/EP2017/058549
§ 371 (c)(1),
(2) Date: Oct. 10, 2018

(87) PCT Pub. No.: WO2017/178427
PCT Pub. Date: Oct. 19, 2017

(65) Prior Publication Data
US 2019/0131497 A1     May 2, 2019

(30) Foreign Application Priority Data
Apr. 14, 2016   (DE) .................. 10 2016 106 928

(51) Int. Cl.
*H01L 33/40* (2010.01)
*H01L 33/44* (2010.01)
(Continued)

(52) U.S. Cl.
CPC ............ *H01L 33/405* (2013.01); *H01L 33/22* (2013.01); *H01L 33/24* (2013.01); *H01L 33/32* (2013.01);
(Continued)

(58) Field of Classification Search
None
See application file for complete search history.

(56) References Cited

U.S. PATENT DOCUMENTS

| 9,231,163 B2 | 1/2016 | Miyachi et al. |
| 2003/0075723 A1 | 4/2003 | Heremans et al. |

(Continued)

FOREIGN PATENT DOCUMENTS

| DE | 10 2007 022 947 A1 | 10/2008 |
| DE | 10 2010 035 966 A1 | 3/2012 |
| DE | 10 2014 101 492 A1 | 8/2015 |

*Primary Examiner* — Nduka E Ojeh
(74) *Attorney, Agent, or Firm* — DLA Piper LLP (US)

(57) ABSTRACT

An optoelectronic semiconductor chip includes a semiconductor body including a first semiconductor region, a second semiconductor region and an active zone disposed between the first and second semiconductor regions, an electrically conductive contact layer arranged on a side of the first semiconductor region facing away from the second semiconductor region, and an electrically conductive mirror layer arranged between the first semiconductor region and the electrically conductive contact layer, and laterally protruding at the edge by the first semiconductor region and the electrically conductive contact layer so that between the first semiconductor region and the electrically conductive contact layer there is an interspace in which a protective layer is arranged for protecting the mirror layer, wherein the electrically conductive contact layer extends laterally to an edge of the first semiconductor region, and the electrically conductive contact layer consists of Ni.

10 Claims, 7 Drawing Sheets

(51) Int. Cl.
*H01L 33/22* (2010.01)
*H01L 33/24* (2010.01)
*H01L 33/32* (2010.01)
*H01L 33/60* (2010.01)
*H01L 33/62* (2010.01)
*H01L 25/075* (2006.01)

(52) U.S. Cl.
CPC .............. *H01L 33/44* (2013.01); *H01L 33/60* (2013.01); *H01L 33/62* (2013.01); *H01L 25/0753* (2013.01); *H01L 2933/0016* (2013.01); *H01L 2933/0025* (2013.01); *H01L 2933/0058* (2013.01); *H01L 2933/0066* (2013.01)

(56) References Cited

U.S. PATENT DOCUMENTS

| | | | |
|---|---|---|---|
| 2006/0249736 A1 | 11/2006 | Lee et al. | |
| 2009/0262773 A1* | 10/2009 | Ahlstedt | H01L 31/022466 372/46.013 |
| 2010/0117111 A1* | 5/2010 | Illek | H01L 33/382 257/98 |
| 2012/0098016 A1* | 4/2012 | Hoppel | H01L 33/44 257/98 |
| 2013/0140598 A1* | 6/2013 | Hoppel | H01L 33/62 257/98 |
| 2013/0228798 A1* | 9/2013 | Hoppel | H01L 33/44 257/79 |
| 2014/0061702 A1* | 3/2014 | Yamamoto | H01L 33/405 257/98 |
| 2014/0151711 A1 | 6/2014 | Yen et al. | |
| 2015/0255692 A1 | 9/2015 | Pfeuffer | |
| 2016/0064602 A1* | 3/2016 | Yen | H01L 33/14 257/98 |

\* cited by examiner

OPTOELECTRONIC SEMICONDUCTOR CHIP AND METHOD OF PRODUCING AN OPTOELECTRONIC SEMICONDUCTOR CHIP

TECHNICAL FIELD

This disclosure relates to an optoelectronic semiconductor chip comprising a semiconductor body with an active zone suitable in particular to generate electromagnetic radiation, as well as a method of producing an optoelectronic semiconductor chip.

BACKGROUND

Known optoelectronic semiconductor chips comprise a mirror layer on the semiconductor body to reflect the electromagnetic radiation emitted by the active zone. A possible method of producing such a semiconductor chip provides for a comparatively thick protective layer of $SiO_2$ on the mirror layer when structuring the semiconductor body, whereby the protective layer serves as an etching mask to structure the semiconductor body. A disadvantage is that the selectivity of the etching mask is limited so that the semiconductor body cannot be etched to any depth. A further disadvantage is that the mirror layer intended in particular for electrical contacting of the semiconductor body, is covered in an electrically insulating manner so that an opening step is necessary for the contacting, which either impairs adhesion of the protective layer around the opening and/or reduces the quality of the mirror layer.

It could therefore be helpful to provide an optoelectronic semiconductor chip with an improved quality with regard to the mirror layer and an improved method of producing such a semiconductor chip.

SUMMARY

I provide an optoelectronic semiconductor chip including a semiconductor body including a first semiconductor region, a second semiconductor region and an active zone disposed between the first and second semiconductor regions, an electrically conductive contact layer arranged on a side of the first semiconductor region facing away from the second semiconductor region, and an electrically conductive mirror layer arranged between the first semiconductor region and the electrically conductive contact layer, and laterally protrudes at the edge by the first semiconductor region and the electrically conductive contact layer so that between the first semiconductor region and the electrically conductive contact layer there is an interspace in which a protective layer is arranged for protecting the mirror layer, wherein the electrically conductive contact layer extends laterally to an edge of the first semiconductor region, and the electrically conductive contact layer consists of Ni.

I also provide a method of producing an optoelectronic semiconductor chip including providing a substrate, applying a semiconductor layer sequence including a first semiconductor region, an active zone on a side of the first semiconductor region facing the substrate and a second semiconductor region on a side of the active zone facing away from the first semiconductor region, applying an electrically conductive mirror layer and an electrically conductive contact layer on the first semiconductor region, wherein the electrically conductive mirror layer is arranged between the first semiconductor region and the electrically conductive contact layer, structuring the electrically conductive contact layer, structuring the electrically conductive mirror layer by the structured electrically conductive contact layer, wherein a groove is formed in the electrically conductive mirror layer so that the mirror layer laterally protrudes at the edge by the first semiconductor region and the electrically conductive contact layer and an interspace is formed between the first semiconductor region and the electrically conductive contact layer, and structuring the semiconductor layer sequence by the structured electrically conductive contact layer.

BRIEF DESCRIPTION OF THE DRAWINGS

FIGS. 1 to 13 and 18 to 20 show different steps of a method of producing an optoelectronic semiconductor chip according to a second example and FIG. 20 an optoelectronic semiconductor chip according to a second example.

Figure 1:
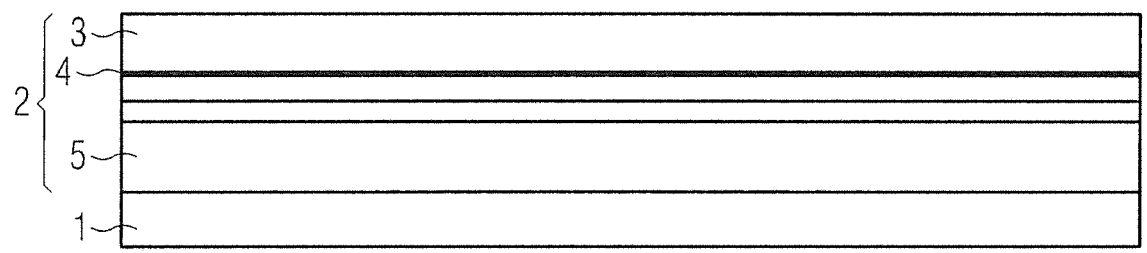
FIGS. 1 to 17 show different steps of a method of producing an optoelectronic semiconductor chip according to a first example and FIG. 17 an optoelectronic semiconductor chip according to a first example.

LIST OF REFERENCE SIGNS 1 substrate
2 semiconductor layer sequence
3 first semiconductor region
4 active zone
5 second semiconductor region
5A connection layer
5B residual region of the second semiconductor region
6, 12 mirror layer
7 contact layer
8 interspace
9 protective layer
10, 13, 16 opening
11, 25 encapsulation
14 planarization
15 insulation layer
17 contact element
18 carrier
19, 24 passivation
20 connection element
21 coupling-out structure
22 semiconductor body
23 optoelectronic semiconductor chip
222 side surface
d lateral dimension
T etching depth
V vertical direction
L lateral dimension

DETAILED DESCRIPTION

My method of producing an optoelectronic semiconductor chip comprises:
providing a substrate,
applying a semiconductor layer sequence comprising a first semiconductor region, an active zone on a side of the first semiconductor region facing the substrate and a second semiconductor region on a side of the active zone facing away from the first semiconductor region,
applying an electrically conductive mirror layer and an electrically conductive contact layer on the first semiconductor region, wherein the electrically conductive mirror layer is arranged between the first semiconductor region and the electrically conductive contact layer, structuring the electrically conductive contact layer,
structuring the electrically conductive mirror layer by the structured electrically conductive contact layer, and
structuring the semiconductor layer sequence by the structured electrically conductive contact layer.

Preferably, the above method steps are carried out in the order indicated.

Preferably, the substrate is a growth substrate on which the first and second semiconductor regions are epitaxially deposited. In this context, "epitaxial deposition on the growth substrate" means that the growth substrate is used for deposition and/or growth of the first and second semiconductor regions. For example, the second semiconductor region is in direct contact with the growth substrate. The growth substrate can be detached after growing the first and second semiconductor region or remain in the finished semiconductor chip, wherein the substrate forms part of a semiconductor body in the latter case.

The electrically conductive mirror layer and contact layer deposited on the semiconductor layer sequence and the first semiconductor region respectively particularly comprise two main lateral extension directions, both perpendicular to a vertical direction in which the first and second semiconductor regions are arranged one above the other. The extent of the two layers along the lateral main extension directions is preferably greater than in the vertical direction. A thickness of the mirror layer and contact layer is determined along the vertical direction.

A groove may be formed during the structuring of the mirror layer in the mirror layer. This means that the mirror layer is slightly retracted under the contact layer. "Slightly" means a lateral projection of the contact layer over the mirror layer which is not more than 1 µm. The formed groove causes the mirror layer to be laterally protruded at the edge by the first semiconductor region and the electrically conductive contact layer and creates an interspace between the first semiconductor region and the electrically conductive contact layer. "Lateral" in particular means an arrangement in or parallel to a main extension plane spanned by the two lateral main extension directions.

Preferably, a photolithographic method is used to structure the contact layer. In particular, the image of a mask is generated in the contact layer. The contact layer can then be structured, for example, by wet chemical etching, whereby regions of the contact layer to be removed are etched away, for example, using hydrochloric acid. The non-released residual regions of the contact layer then serve as a mask to structure the mirror layer and the semiconductor layer sequence. Thicknesses of 100 nm to 200 nm are suitable for the contact layer. Preferably, the electrically conductive contact layer is formed from Ni. The advantage of an electrically conductive material such as Ni is that, compared to a conventional etching mask made of an electrically insulating material such as $SiO_2$, no opening step is required to contact the mirror layer. Instead, the mirror layer can be electrically contacted by the electrically conductive contact layer.

The mirror layer can also be structured by wet chemical etching. The structured electrically conductive contact layer serves as an etching mask by which the structure of the mirror layer is determined. Preferably, an etchant is used which acts selectively against the material of the contact layer and leads to a slight under-etching of the contact layer. Preferably, the mirror layer is formed from Ag or a material based on Ag.

A connecting layer may be arranged between the mirror layer and the contact layer, which is formed of a transparent electrically conductive oxide. Transparent electrically conductive oxides (TCOs) are transparent, conductive materials, usually metal oxides such as zinc oxide, tin oxide, cadmium oxide, titanium oxide, indium oxide or indium tin oxide (ITO). In addition to binary metal oxygen compounds such as ZnO, $SnO_2$ or $In_2O_3$, ternary metal oxygen compounds such as $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p- or n-doped.

A protective layer may be placed in the interspace between the mirror layer to protect the mirror layer. In particular, the protective layer can prevent the mirror layer from being further removed during further structuring steps, in particular during etching of the semiconductor layer sequence. The protective layer can be made of electrically weakly conductive or insulating materials and/or one of the materials $SiO_2$, $Al_2O_3$. The protective layer fills the interspace in the finished semiconductor chip at least partially. In the finished semiconductor chip, the protective layer preferably does not protrude laterally beyond the contact layer. Furthermore, it is advantageous to cover the entire surface of the protective layer with the contact layer. This means in particular that a surface of the protective layer facing the contact layer is completely covered by the contact layer. During production of the protective layer, the material used for the protective layer, for example, TEOS (tetraethyl orthosilicate) can initially also be applied in gaseous state to regions of the first semiconductor region that lie outside the interspace. By a stripping process, in particular by a dry etching process such as reactive ion etching (so-called RIE), the material is then structured such that the regions of the first semiconductor region that lie outside the interspace are not covered by the protective layer. The structured contact layer can largely, preferably completely, prevent a removal of the protective layer below the contact layer. Fluorine can be used as etchant. For example, the material of the protective layer can also be applied on the first semiconductor region by atomic layer deposition (so-called ALD). In this connection $Al_2O_3$ is particularly suitable as a material for the protective layer.

The semiconductor layer sequence may be structured after the protective layer has been applied. Preferably, the semiconductor layer sequence is structured by the structured electrically conductive contact layer, i.e., the electrically conductive contact layer serves as a shaping mask. In particular, a dry etching process, preferably reactive ion etching, is also used here. Chlorine can be used as etchant.

For the semiconductor layer sequence and the first and second semiconductor regions of the semiconductor body, materials preferably based on nitride compound semiconductors are considered. "Based on nitride compound semiconductors" means that at least one layer of the semiconductor layer sequence comprises a nitride III/V compound semiconductor material, preferably $Al_nGa_mIn_{1-n-m}N$, where $0 \leq n \leq 1$, $0 \leq m \leq 1$ and $n+m \leq 1$. This material does not necessarily have to have a mathematically exact composition according to the above formula. Rather, it may contain one or more dopants and additional components that do not substantially alter the characteristic physical properties of the $Al_nGa_mIn_{1-n-m}N$ material. For simplicity, however, the above formula contains only the essential components of the crystal lattice (Al, Ga, In, N), even if they can be partially replaced by small amounts of other substances.

Preferably, the first semiconductor region is a p-conducting region. Furthermore, the second semiconductor region is in particular an n-conducting region.

Advantageously, a comparatively high selectivity of 20:1 to 50:1 can be achieved between the semiconductor layer sequence and the electrically conductive contact layer in the method. This allows etching depths that are advantageously larger than 2 μm. In particular, the second semiconductor region comprises a connection layer, whereby the second semiconductor region is structured up to a lower edge of the connection layer. A residual region of the second semiconductor region located between the connection layer and the substrate thus protrudes laterally beyond the structured semiconductor layer sequence. The connection layer is preferably a highly doped semiconductor layer of the second semiconductor region. In particular, the connection layer may have the highest doping in the semiconductor layer sequence. In other words, the connection layer can be doped at least in certain regions to such an extent that it has a higher doping than all other regions of the semiconductor layer sequence.

A mesa form may be formed during structuring of the semiconductor layer sequence. In other words, after structuring, the semiconductor layer sequence can have a cross-sectional shape that widens from the first semiconductor region to the second semiconductor region. A vertical expansion or height of the mesa-shaped region corresponds to the etching depth.

The electrically conductive mirror layer and contact layer may be provided with an opening. Preferably, the opening is wet-chemical produced. The opening extends advantageously in a vertical direction through the contact layer and mirror layer on the first semiconductor region. In particular, the opening is located in a central region of the contact layer and mirror layer. Alternatively, this step can be omitted. This means that the mirror layer and the contact layer can be designed without interruption. In particular, the mirror layer and the contact layer of the finished semiconductor chip will then be uninterrupted or continuous.

An outer surface of a compound facing away from the substrate, which comprises the substrate, the semiconductor layer sequence and other layers arranged on the semiconductor layer sequence, in particular the mirror layer and the contact layer, may be covered with an encapsulation. Furthermore, the opening in the mirror and contact layer can be filled with the encapsulation. Low-conducting or insulating materials such as $SiO_2$ are preferred for the encapsulation. The encapsulation can be applied by the already mentioned atomic layer deposition.

A further mirror layer may be applied to the compound that now also comprises the encapsulation. The further mirror layer can be applied by sputtering. In particular, the further mirror layer is applied to the encapsulation. Preferably, the further mirror layer is arranged so that it covers the contact layer in regions on a side facing away from the first semiconductor region and is also arranged on side surfaces of the first and second semiconductor regions. Preferably, the further mirror layer is formed from a metallic material, for example, Al or Rh. The further mirror layer is provided with at least one opening, especially in the region of the contact layer in which a contact element can later be arranged for electrical contacting of the contact layer.

The compound, which now additionally comprises the further mirror layer, may be provided with a planarization covering side surfaces of the first and second semiconductor region and filling at least one opening of the further mirror layer. Furthermore, the planarization preferably covers the residual region of the second semiconductor region and is laterally flush with it. Low-conducting or insulating materials such as $SiO_2$ are preferred for the planarization.

An insulation layer may be arranged on an outer surface of the compound, which is arranged on a side of the first semiconductor region facing away from the substrate. Preferably, electrically insulating materials such as $SiO_2$ are used for the insulation layer.

A further opening may be created through the at least one opening of the further mirror layer, which in particular has a smaller diameter than the existing opening and extends through all layers, i.e., in particular the insulation layer, the planarization and the encapsulation, to the contact layer. For example, the further opening can be created by a dry etching process such as reactive ion etching. In particular, fluorine is used as an etchant.

A contact element may be formed in the at least one further opening. The contact element is preferably made of at least one electrically conductive material, in particular a metal or a metal compound. For example, the contact element can be made of two different materials, for example, Rh and Ni or, instead of Ni, of a Ni alloy such as NiSn.

A carrier may be applied to one side of the compound facing away from the substrate. For example, silicon can be used as a material for the carrier. This shows a particularly good thermal conductivity.

The substrate on which the semiconductor layer sequence is arranged preferably contains or consists of a semiconductor material. Materials such as sapphire, SiC and/or GaN can be used. A sapphire substrate is transparent to short-wave visible radiation, especially in the blue to green range. Since the wavelength of the radiation emitted by the active zone is particularly present in this wavelength range, such a growth substrate is permeable to the radiation emitted by the active zone.

Preferably, the substrate can remain in the finished semiconductor chip. This is particularly the case when the substrate is transparent to the generated radiation and the semiconductor chip is a flip chip, in which the generated radiation is coupled out from the semiconductor chip through the substrate.

Alternatively, the substrate is detached from the semiconductor layer sequence. For example, the substrate can be removed from the semiconductor layer sequence using Laser Lift Off. A semiconductor chip in which the substrate is detached is called a thin-film semiconductor chip.

The substrate may be detached and the second semiconductor region is thinned after detachment. This is especially done up to the lower edge of the connection layer. Preferably, the residual of the second semiconductor region is removed using a dry etching process such as reactive ion etching. A coupling-out structure can be arranged on the connection layer, which improves the coupling-out of radiation from the semiconductor body. In particular, the coupling-out structure is formed from a low absorbing material such as $TiO_2$ or $Nb_2O_5$. Preferably, a passivation is arranged between the second semiconductor region and the coupling-out structure, which is formed in particular from $SiO_2$.

Alternatively, the residual region of the second semiconductor region is not removed. In particular, the residual region is structured such that a coupling-out structure is formed that improves the coupling-out of radiation from the semiconductor body. For example, the residual region is roughened. This can be done by a dry etching process such as reactive ion etching. Preferably, a passivation is arranged on the coupling-out structure formed in particular from $SiO_2$ or $Al_2O_3$.

There are various possibilities for the electrical contacting of the semiconductor chip or for the current injection in the semiconductor chip.

According to a first example, a connection element can be provided on the second semiconductor region for current injection in the second semiconductor region, which is arranged in particular centrally and covers only a small part of the second semiconductor region. As already mentioned above, the mirror layer and the contact layer, which are intended for current injection in the first semiconductor region, are preferably provided with an opening arranged in a central region. In particular, the connection element and the opening are arranged one above the other in a vertical direction. Furthermore, the opening is preferably filled with an electrically insulating material, especially with the encapsulation. In the arrangement described, there is no direct current path between the connection element and the mirror layer during operation. Rather, the current paths are laterally widened.

According to a second example, a contacting layer can be applied to the second semiconductor region for current injection in the second semiconductor region, which largely covers the second semiconductor region. The mirror layer and the contact layer, which are intended for current injection in the first semiconductor region, are preferably formed continuously. In the arrangement described, there are direct current paths between the mirror layer and the contacting layer during operation.

My optoelectronic semiconductor chip may comprise a semiconductor body having a first semiconductor region, a second semiconductor region and an active zone disposed between the first and second semiconductor regions. Furthermore, the optoelectronic semiconductor chip comprises an electrically conductive contact layer arranged on a side of the first semiconductor region facing away from the second semiconductor region. The electrically conductive contact layer extends preferably laterally to an edge of the first semiconductor region. Furthermore, an electrically conductive mirror layer is arranged between the first semiconductor region and the electrically conductive contact layer, which is laterally protruded at the edge by the electrically conductive contact layer. At the same time, the electrically conductive mirror layer can be laterally protruded at the edge by the first semiconductor region. This creates an interspace between the first semiconductor region and the electrically conductive contact layer. It is advantageous to place a protective layer in the interspace to protect the mirror layer.

The optoelectronic semiconductor chip is preferably manufactured using one of the methods described above. This means that the optoelectronic semiconductor chip can have all features mentioned in connection with the method.

The active zone of the semiconductor body may be intended to generate electromagnetic radiation. In this case, "electromagnetic radiation" refers in particular to infrared, visible and/or ultraviolet electromagnetic radiation. During operation, the majority of the generated radiation preferably exits at a radiation exit side of the semiconductor chip, which is located on a side of the second semiconductor region facing away from the first semiconductor region. A rear side of the semiconductor chip is located on a side of the first semiconductor region facing away from the second semiconductor region.

The optoelectronic semiconductor chip can have an electrically conductive contact layer containing Ni or consisting of Ni. Furthermore, the electrically conductive reflective layer can contain Ag or consist of Ag. In particular, the mirror layer is suitable for reflecting a large part of the incident radiation in the direction of the radiation exit side.

Furthermore, the optoelectronic semiconductor chip may have a protective layer formed of an electrically weakly conductive or insulating material and/or containing one of the materials $SiO_2$, $Al_2O_3$.

A connecting layer may be arranged between the mirror layer and the contact layer, which is formed of a transparent electrically conductive oxide. For example, the connecting layer may contain ZnO. The contact resistance between contact layer and mirror layer can be increased by the connecting layer so that the current flow or current injection can be adjusted as desired by the connecting layer.

The optoelectronic semiconductor chip may comprise a further mirror layer arranged on one side of the electrically conductive contact layer facing away from the semiconductor body, the further mirror layer extending laterally beyond the contact layer and covering side surfaces of the semiconductor body. By the further mirror layer, the proportion of radiation reflected in the direction of the radiation exit side can be further increased. Preferably, the further mirror layer is an electrically conductive, especially metallic layer. For example, the mirror layer can be formed from Al or Rh.

The encapsulation may be arranged between the semiconductor body and the further mirror layer. Furthermore, in particular the semiconductor body, the mirror layer and the contact layer are laterally enclosed by the planarization. The further mirror layer is also laterally surrounded by the planarization.

Preferably, the additional mirror layer is electrically insulated. In particular, the further mirror layer is electrically insulated by the surrounding layers that include the encapsulation and the planarization, for example.

The optoelectronic semiconductor chip may comprise at least one contact element for electrically contacting the contact layer, wherein the contact element is arranged in an opening in the further mirror layer. The contact element preferably contains at least one electrically conductive material, in particular a metal or a metal compound. For example, Rh and Ni or instead of pure Ni, a Ni alloy such as NiSn can be used for the contact element. The at least one contact element can be a vertical through-connection extending from a front side of the carrier facing the semiconductor body to the contact layer. Alternatively, the contact element can be a contact frame. This runs in plan view on the semiconductor chip preferably along the side edges of the carrier.

The second semiconductor region may comprise a connection layer having the highest doping in the semiconductor body. In other words, the connection layer can be doped at least in certain regions to such an extent that it has a higher doping than all other regions of the semiconductor body. Preferably, the connection layer confines the semiconductor body on its side facing away from the first semiconductor region of the second semiconductor region. This means that the connection layer forms a layer terminating the semiconductor body on its side of the second semiconductor region facing away from the first semiconductor region.

The cross-section of the semiconductor body may have a shape that widens from the first semiconductor region to the second semiconductor region. In other words, the cross-section of the semiconductor body has an inverted mesa shape.

Using the method described above, it is possible to produce comparatively small semiconductor chips. For example, a semiconductor chip described here may have side lengths of at most 150 µm.

Further advantages and developments result from the examples described below in conjunction with FIGS. 1 to 20.

FIG. 1 shows a step of a method of producing an optoelectronic semiconductor chip in which a substrate 1 is provided and a semiconductor layer sequence 2 is applied to it. First, an n-conducting second semiconductor region 5 is arranged on the substrate 1 and a p-conducting first semiconductor region 3 is further arranged on the n-conducting semiconductor region 5. An active zone 4 is formed between the first and second semiconductor regions 3, 5. In other words, the semiconductor layer sequence 2 comprises a first semiconductor region 3, an active zone 4 on a side of the first semiconductor region 3 facing the substrate 1 and a second semiconductor region 5 on a side of the active zone 4 facing away from the first semiconductor region 3. Materials preferably based on nitride compound semiconductors, in particular GaN, are considered for the semiconductor layer sequence 2 and the first and second semiconductor regions 3, 5. Preferably, the first semiconductor region 3 on the second semiconductor region 5 and the second semiconductor region 5 on the substrate 1 are epitaxially deposited, for example, by organometallic vapor phase epitaxy. In particular, the second semiconductor region 5 is thicker than the first semiconductor region 3. For example, the first semiconductor region 3 with a thickness of 130 nm can be formed. The second semiconductor region can be formed with a thickness of 6 µm. Deviations of 10% are tolerable.

Figure 2:
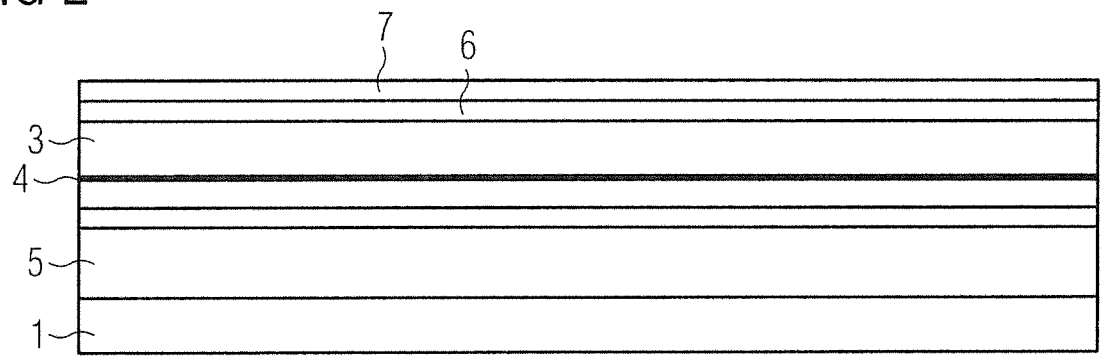

FIG. 2 shows a further method step in which a mirror layer 6 is applied on the first semiconductor region 3. Furthermore, a contact layer 7 is applied on the first semiconductor region 3 or mirror layer 6. Preferably the mirror layer 6 is formed of an electrically conductive material, especially a metal such as Ag. Contact layer 7 can be made of an electrically conductive material, in particular a metal such as Ni.

Preferably, a connecting layer is placed on the mirror layer 6 before the contact layer 7 is applied (not shown). The electrical conductivity of the mirror layer 6 can be changed by the connecting layer. For example, the connecting layer can be formed of a transparent electrically conductive oxide. The contact resistance of the mirror layer 6 can be increased by the connecting layer.

Figure 3:
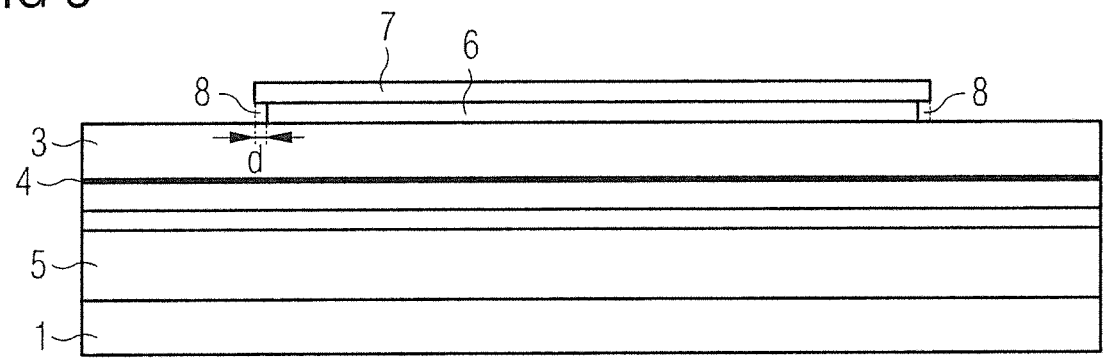

FIG. 3 shows further steps of the method. First, the electrically conductive contact layer 7 is structured. Preferably a photolithographic process is used to structure the contact layer 7. In particular, the image of a mask is generated in the contact layer 7. Subsequently, the contact layer 7 can be structured, for example, by wet chemical etching, whereby regions of the contact layer 7 to be removed are etched away, for example, by hydrochloric acid. The non-released residual regions of the contact layer 7 then serve as a mask for structuring the mirror layer 6 and the semiconductor layer sequence 2. Thicknesses of 100 nm to 200 nm are suitable for the contact layer 7.

The mirror layer 6 is then structured using the structured contact layer 7. This can be done by wet chemical etching. In particular, an etchant is used that acts selectively against the material of the contact layer 7 and leads to a slight undercutting of the contact layer 7. A groove is formed in the mirror layer 6 so that the mirror layer 6 is laterally protruded at the edge by the first semiconductor region 3 and the electrically conductive contact layer 7 and an interspace 8 is formed between the first semiconductor region 3 and the electrically conductive contact layer 7. The interspace 8 has a lateral dimension d, which is at most 1 µm. In other words, the lateral projection of the contact layer 7 over the mirror layer 6 is at most 1 µm.

Figure 4:
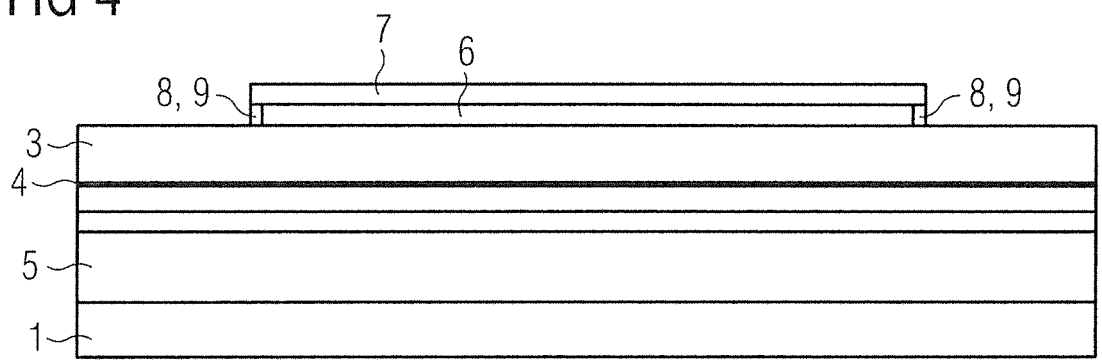

FIG. 4 shows a further method step in which a protective layer 9 is produced in the interspace 8. The material used for layer 9 can initially also be applied to regions of the first semiconductor region 3 that lie outside the interspace 8. By a stripping process, in particular by a dry etching process such as reactive ion etching (so-called RIE), the material is then structured such that the regions of the first semiconductor region 3 that lie outside the interspace 8 are uncovered by the protective layer 9. The protective layer 9 at least partially fills the interspace 8. The structured contact layer 7 can largely, preferably completely, prevent a removal of the protective layer 9 below the contact layer 7. Fluorine can be used as etchant. For the protective layer 9, electrically weakly conductive or insulating materials and/or one of the materials $SiO_2$, $Al_2O_3$ can be used. For example, $SiO_2$ TEOS (tetraethyl orthosilicate), is applied at low pressure and low flow rate with a thickness of 50 nm to 400 nm, can be used as a starting material. Alternatively, the material can be deposited by atomic layer deposition (so-called ALD). In particular, the protective layer 9 can prevent the mirror layer 6 from being attacked during further structuring steps, in particular during etching of semiconductor layer sequence 2.

Figure 5:
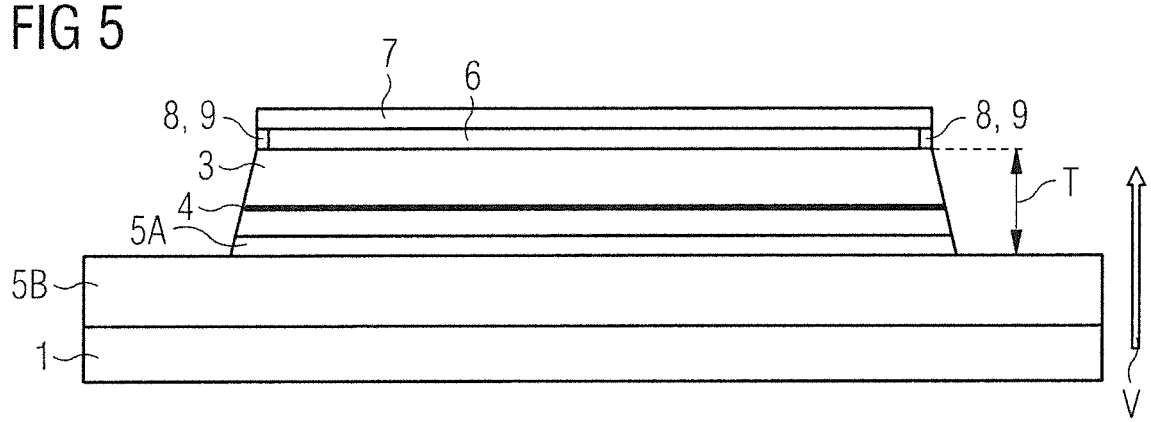

FIG. 5 shows a further method step in which the semiconductor layer sequence 2 is structured. The semiconductor layer sequence 2 is structured using the structured contact layer 7, i.e., the structured contact layer 7 serves as a shaping mask. In particular, a dry etching process, preferably reactive ion etching, is used. Chlorine can be used as etchant.

Advantageously, a comparatively high selectivity of 20:1 to 50:1 can be achieved between semiconductor layer sequence 2 and structured contact layer 7 in the method described here. This allows etching depths T, which are advantageously larger than 2 µm. In particular, the second semiconductor region 5 comprises a connection layer 5A, whereby the second semiconductor region 5 is structured up to a lower edge of the connection layer 5A. A residual region 5B of the second semiconductor region 5 arranged between connection layer 5A and the substrate 1 thus protrudes laterally beyond the structured semiconductor layer sequence. The connection layer 5A is preferably a highly doped semiconductor layer of the second semiconductor region 5. The connection layer 5A in particular can have a highest doping in the semiconductor layer sequence 2. The structured semiconductor layer sequence has a mesa form whose vertical extent or height is identical to the etching depth T. The cross-section of the structured semiconductor layer sequence has a form that widens from the first semiconductor region 3 to the second semiconductor region 5.

Figure 6:
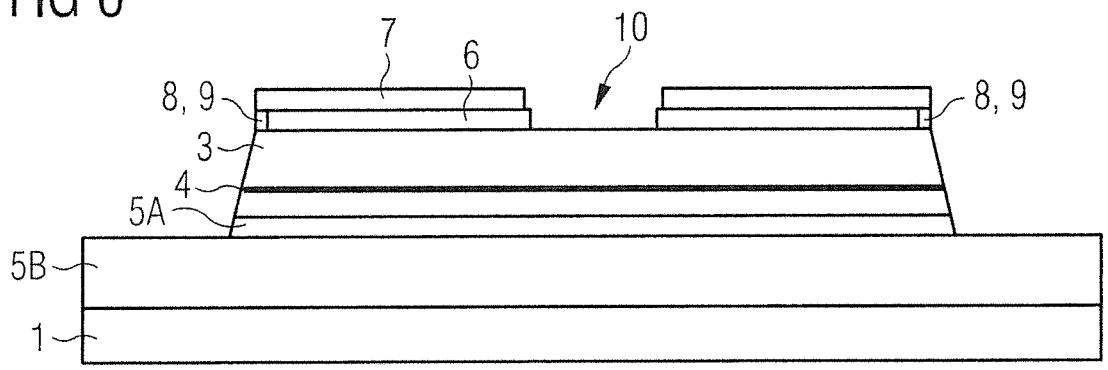

FIG. 6 shows a further possible method step in which the mirror layer 6 and the contact layer 7 are provided with an opening 10. Preferably, the contact layer 7 is initially opened, for example, wet-chemical with HCl. Subsequently, the opening in the mirror layer 6 can be produced by the opening in the contact layer 7, for example, also wet-chemical. Alternatively, this step can be omitted. This means that the mirror layer 6 and the contact layer 7 can be designed without interruption.

Figure 7:
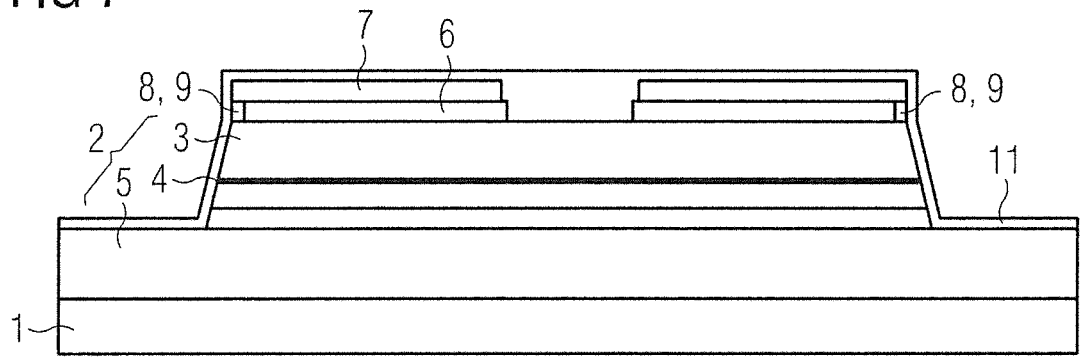

FIG. 7 shows a further method step in which a compound consisting of the substrate 1, semiconductor layer sequence 2 and further layers 6, 7, 9 arranged on semiconductor layer sequence 2 is provided with an encapsulation 11. In particular, an outer surface of the compound is covered with the encapsulation 11. Preferably weakly conductive or insulating materials such as SiO$_2$ are used for the encapsulation 11. Encapsulation 11 can be applied by the already mentioned atomic layer deposition.

Figure 8:
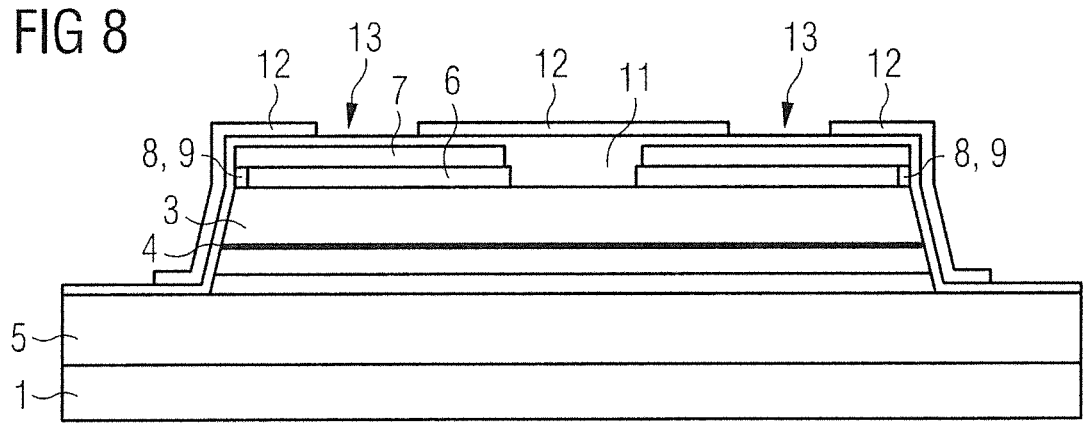

FIG. 8 shows a further method step in which a further mirror layer 12 is applied to encapsulation 11. The mirror layer 12 can initially be applied to a surface of the encapsulation 11 facing away from the semiconductor layer sequence 2 so that it completely covers the surface. For example, the mirror layer 12 can be sputtered on. Metals such as Al or Rh are particularly suitable as materials for the mirror layer 12. The mirror layer 12 can then be structured so that it covers the surface only in certain regions. The structuring, i.e., the removal of the mirror layer 12 in certain regions, can be carried out wet-chemically, for example. Phosphoric acid (H$_3$PO$_4$) can be used as etchant. Preferably, at least one opening 13 is created in the mirror layer 12, which is arranged downstream of the contact layer 7 in the vertical direction starting from semiconductor layer sequence 2. Opening 13 is later used to make contact with the contact layer 7. In particular two further openings 13 are created as shown. Alternatively, a frame-shaped recess can be formed which has a cross-sectional shape corresponding to the openings 13.

Figure 9:
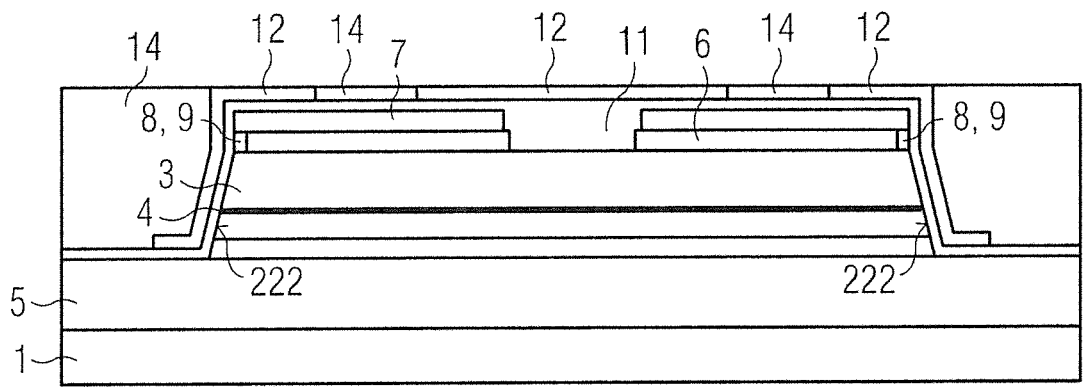

FIG. 9 shows a further method step in which the compound is provided with a planarization 14. In particular, the material of the planarization 14 is initially applied to an outer surface of the compound facing away from substrate 1. The planarization 14 is designed such that it covers side surfaces 222 of the first and second semiconductor region 3, 5 and the semiconductor layer sequence 2, respectively, and that fills at least one opening 13 of the further mirror layer 12. Furthermore, the planarization 14 preferably covers the residual region 5B of the second semiconductor region 5 and is laterally flush with it. Preferably weakly conductive or insulating materials such as SiO$_2$ are used for the planarization 14. Using planarization 14, the compound of substrate 1, semiconductor layer sequence 2 and the other layers 6, 7, 9, 11, 12, 14 has a rectangular shape in cross-section.

Figure 10:
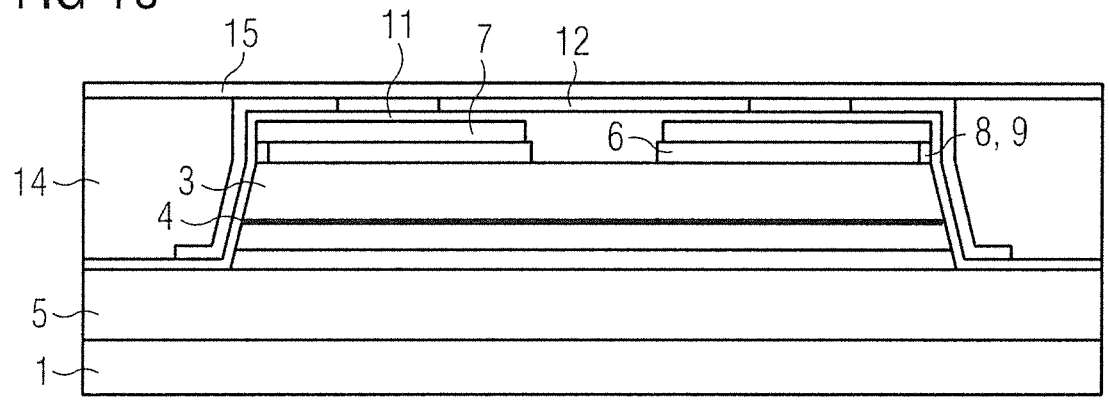

FIG. 10 shows a further method step in which an insulation layer 15 is arranged on an outer surface of the compound. Preferably 15 electrically insulating materials such as SiO$_2$ are used for the insulation layer. It is advantageous that the insulation layer 15 covers the still exposed surfaces of the mirror layer 12. By the encapsulation 11, the planarization 14 and the insulation layer 15, the mirror layer 12 is preferably embedded in electrically insulating material. The mirror layer 12 is thus electrically insulated.

Figure 11:
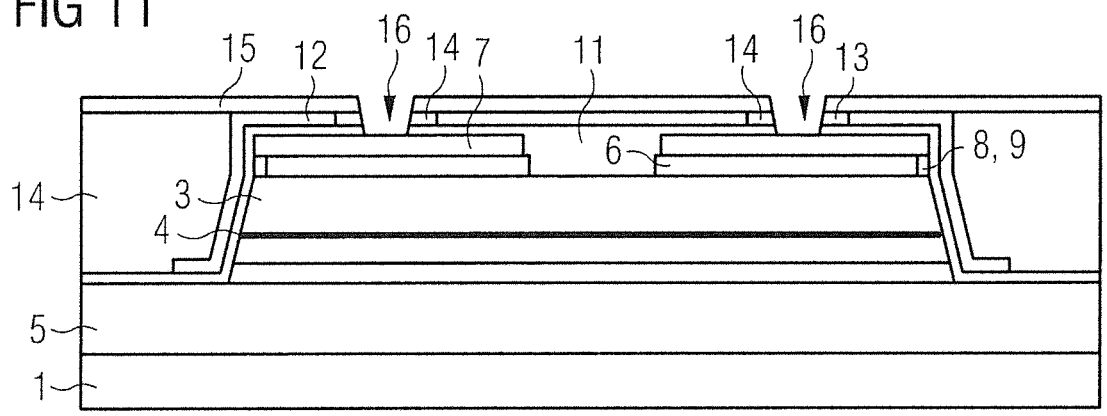

FIG. 11 shows a further method step in which a further opening 16 is produced through the at least one opening 13 of the further mirror layer 12, which has a smaller diameter than the existing opening 13 and extends through all layers 11, 14, 15 to the contact layer 7. For example, the further opening 16 can be produced by a dry etching process such as reactive ion etching. In particular, fluorine is used as an etchant. Preferably, two additional openings 16 are created as shown. Alternatively, a frame-shaped recess can be formed which has a cross-sectional shape corresponding to the openings 16.

Figure 12:
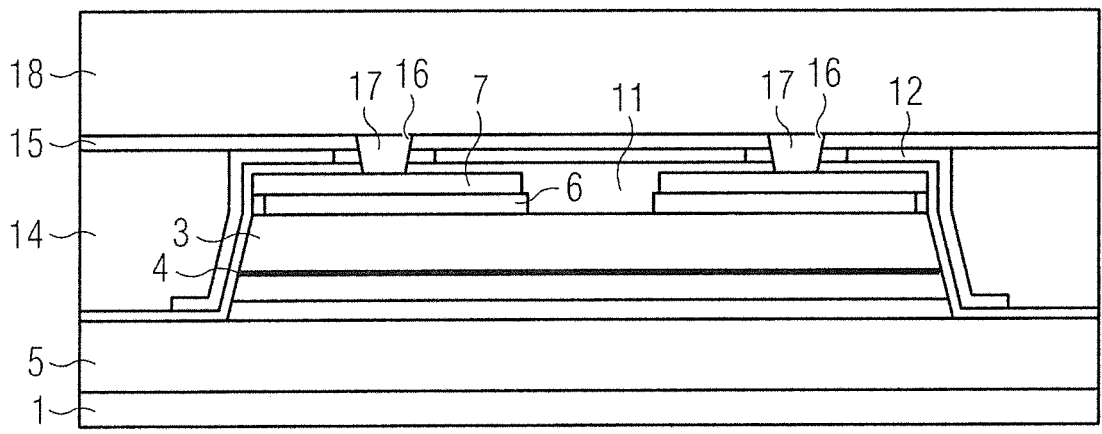

FIG. 12 shows a further method step in which in the at least one further opening 16 a contact element 17 is formed. The contact element 17 is preferably made of at least one electrically conductive material, in particular a metal or a metal compound. For example, Rh and Ni or instead of Ni a Ni alloy such as NiSn can be used for the contact element 17. Furthermore, a carrier 18 is applied to one side of the compound facing away from the substrate 1. The carrier 18 preferably contains a material with comparatively high thermal conductivity. For example, silicon can be used as the material for the carrier 18.

Figure 13:
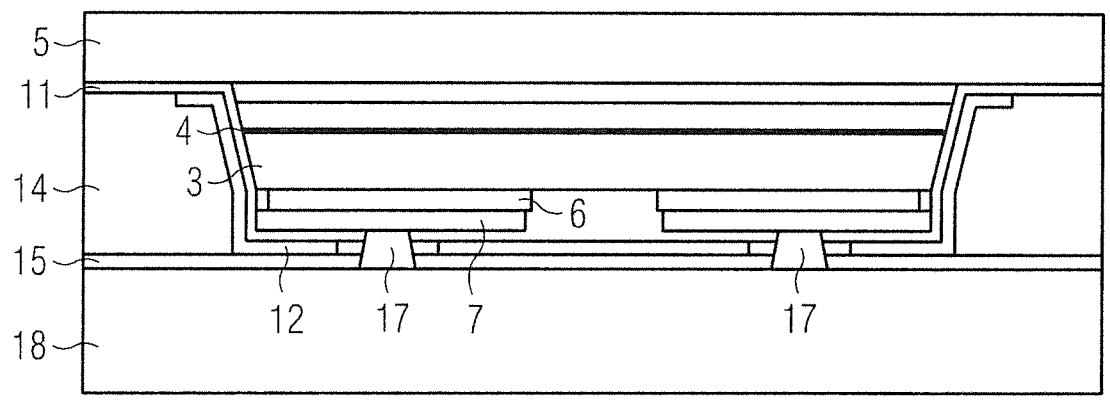

FIG. 13 shows a further method step in which substrate 1 is removed. For example, substrate 1 can be removed from the semiconductor layer sequence 2 using Laser Lift Off.

FIGS. 14 to 17 show further method steps of a method according to a first example.

Figure 14:
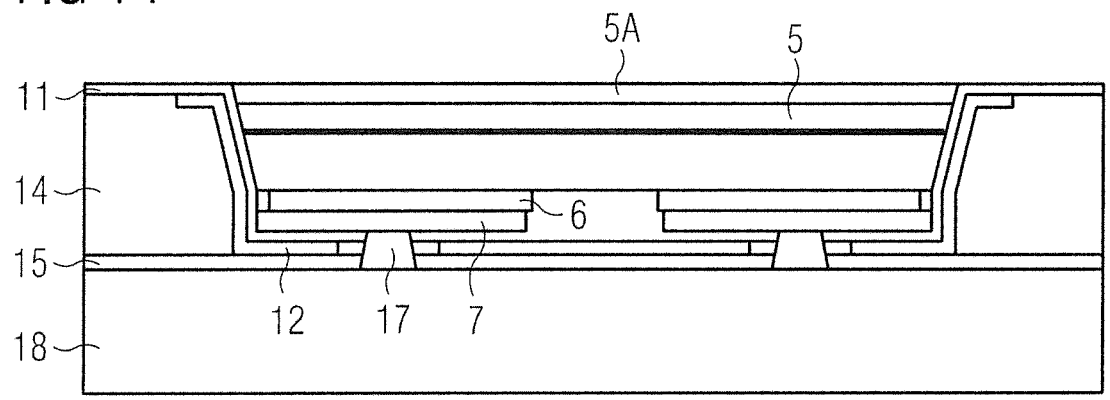

In the method step shown in FIG. 14, the second semiconductor region 5 is thinned up to a lower edge of the connection layer 5A. The residual region 5B is thus completely removed. Preferably, the residual region 5B of the second semiconductor region 5 is removed by a dry etching process such as reactive ion etching.

Figure 15:
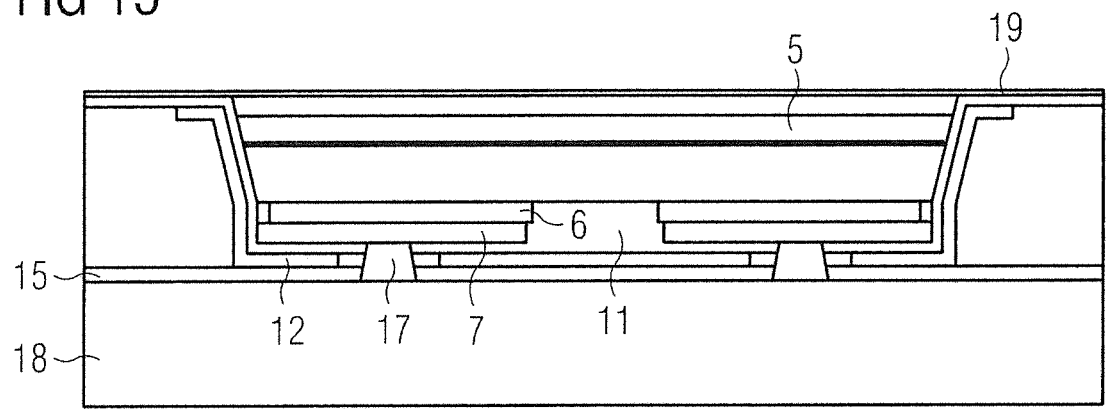

FIG. 15 shows a further method step in which a passivation 19 is applied to the outer surface of the compound facing away from the carrier 18. The passivation 19 is advantageously formed from an electrically weak or non-conductive material such as SiO$_2$. The production can be carried out by atomic layer deposition.

Figure 16:
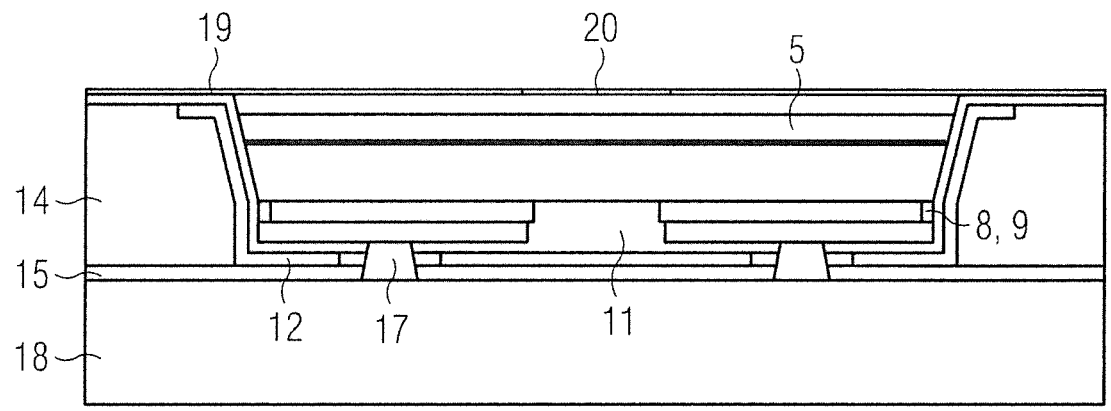

FIG. 16 shows a further method step in which the passivation 19 is opened in a central region. This can be done dry- or wet-chemical. A connection element 20 is formed in the opening thus created. Transparent electrically conductive oxides are particularly suitable materials for the connection element 20.

Figure 17:
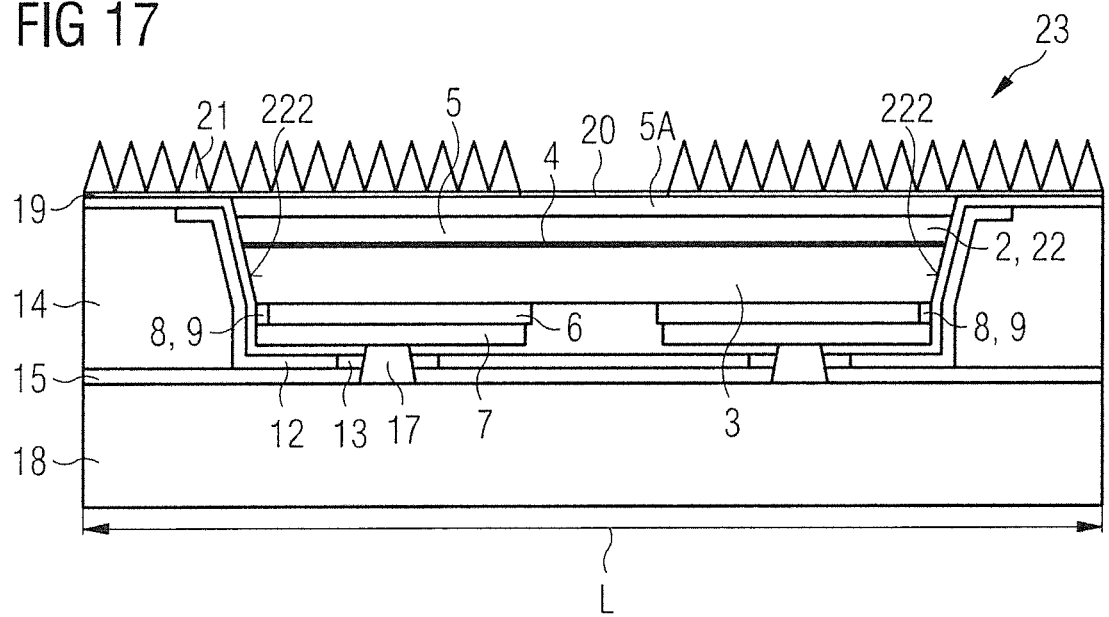
Figure 18:
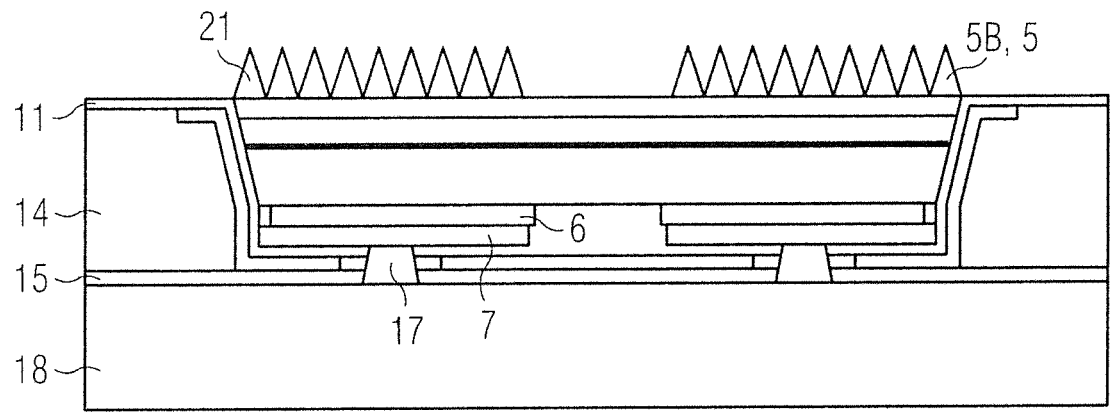
Figure 19:
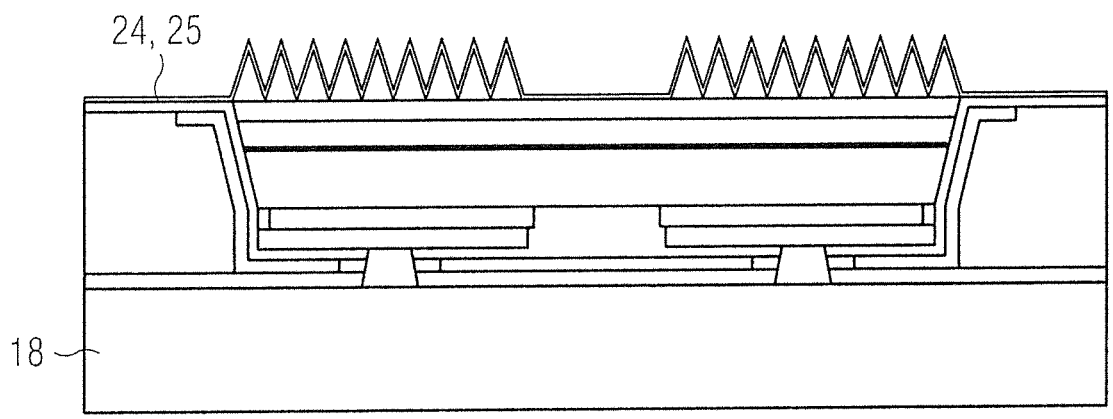

FIG. 17 shows a further method step in which a coupling-out structure 21 is arranged on the connection layer 5A or the passivation 19. In particular, the coupling-out structure 21 is formed from a low absorbing material such as TiO$_2$ or Nb$_2$O$_5$. Initially, the material for the coupling-out structure 21 can be applied in a homogeneous layer and then provided with elevations and recesses so that a desired coupling-out structure 21 results.

FIG. 17 also shows an optoelectronic semiconductor chip 23 having a semiconductor body 22 with a first semiconductor region 3, a second semiconductor region 5 and an active zone 4 arranged between the first and second semiconductor regions 3, 5. Furthermore, the optoelectronic semiconductor chip 23 comprises an electrically conductive contact layer 7 arranged on a side of the first semiconductor region 3 facing away from the second semiconductor region 5. Furthermore, the optoelectronic semiconductor chip 23 comprises an electrically conductive mirror layer 6 arranged between the first semiconductor region 3 and the electrically conductive contact layer 7 and is laterally protruded at the edge by the first semiconductor region 3 and the electrically conductive contact layer 7 so that between the first semiconductor region 3 and the electrically conductive contact layer 7 there is an interspace 8 in which a protective layer 9 is arranged to protect the mirror layer, wherein the electrically conductive contact layer 7 extends laterally to an edge of the first semiconductor region 3.

The optoelectronic semiconductor chip 23 comprises a further mirror layer 12 arranged on one side of the electrically conductive contact layer 7 facing away from the semiconductor body 22, the further mirror layer 12 extending laterally beyond the contact layer 7 and covering side surfaces 222 of the semiconductor body 23.

Furthermore, the optoelectronic semiconductor chip 23 comprises at least one contact element 17 or a contact frame for electrically contacting the contact layer 7 on, wherein the contact element 17 is arranged in an opening 13 of the further mirror layer 12.

Although the cross-section of the semiconductor body 22 has a shape that widens from the first semiconductor region 3 to the second semiconductor region 5. Nevertheless, the cross-section of the semiconductor chip 23 has a rectangular shape. This can be achieved by the planarization 14, which surrounds the semiconductor body 22, the mirror layer 12 and the contact layer 7 laterally.

The second semiconductor region 5 comprises a connection layer 5A comprising a highest doping in the semiconductor body 22. The connection layer 5A confines the semiconductor body 22 on its side of the second semiconductor region 5 facing away from the first semiconductor region 3.

During operation, the majority of the radiation generated in the active zone 4 preferably exits at a radiation exit side of the semiconductor chip 23, which is located on a side of the second semiconductor region 5 facing away from the first semiconductor region 3. The coupling-out structure 21 is located on the radiation exit side, which improves the coupling-out of radiation from the semiconductor body 22.

The substrate of the optoelectronic semiconductor chip 23 is detached. It is therefore a thin-film chip. The lateral dimensions of the semiconductor chip 23 are determined in particular by the substrate or carrier and amount to at most L=150 µm.

In conjunction with FIGS. 1 to 13 and 18 to 20, a method according to a second example is shown. The coupling-out structure 21 is produced by structuring the second semiconductor region 5, in particular the residual region 5B (see FIG. 18). For example, the second semiconductor region 5 or the residual region 5B is roughened. This can be done by a dry etching process such as reactive ion etching. A passivation 24 and encapsulation 25 can then be applied, covering the compound on a side facing away from the carrier 18 (see FIG. 19). For example, the passivation 24 can be formed from $Al_2O_3$ by atomic layer deposition. The encapsulation can be formed from SiO2 by gas phase deposition. The Passivation 24 and encapsulation 25 can be opened in a central region. This can be dry- or wet-chemical. A connection element 20 is formed in the opening thus created (see FIG. 20). Transparent electrically conductive oxides are particularly suitable materials for the connection element 20.

Figure 20:
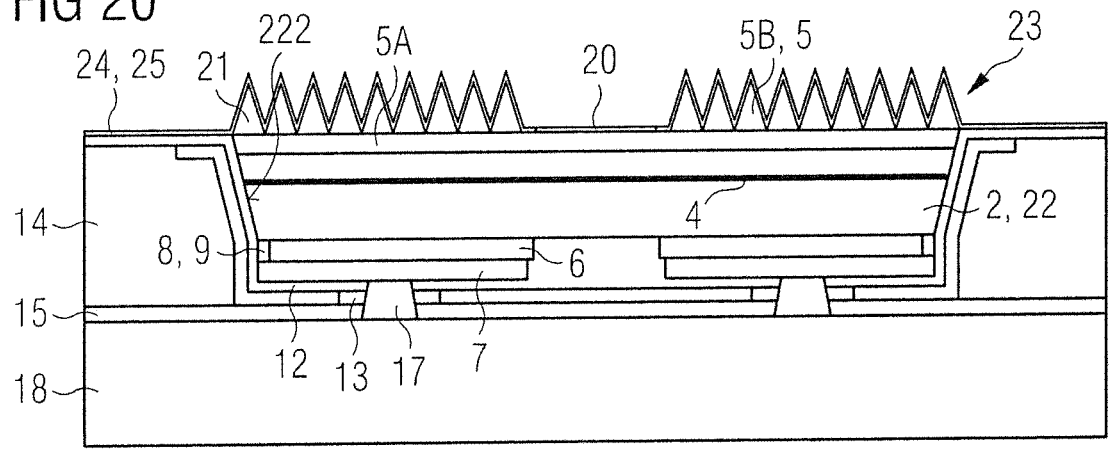

FIG. 20 also shows an optoelectronic semiconductor chip 23. This optoelectronic semiconductor chip 23 is similar to the semiconductor chip described in FIG. 17, but differs in terms of the coupling-out structure 21 as already described in FIGS. 18 and 19.

My chips and methods are not limited by the description based on the examples. Rather, this disclosure includes each new feature and each combination of features, which includes in particular each combination of features in the appended claims, even if the feature or combination itself is not explicitly indicated in the claims or examples.

This application claims priority of DE 10 2016 106 928.0, the subject matter of which is incorporated herein by reference.

The invention claimed is:

1. An optoelectronic semiconductor chip comprising:
   a semiconductor body comprising a first semiconductor region, a second semiconductor region and an active zone disposed between the first and second semiconductor regions,
   an electrically conductive contact layer arranged on a side of the first semiconductor region facing away from the second semiconductor region, and
   an electrically conductive mirror layer arranged between the first semiconductor region and the electrically conductive contact layer, and the first semiconductor region and the electrically conductive contact layer laterally protrude at the edge of the electrically conductive mirror layer so that between the first semiconductor region and the electrically conductive contact layer there is an interspace in which a protective layer is arranged for protecting the mirror layer, wherein
   the electrically conductive contact layer extends laterally to an edge of the first semiconductor region, and the electrically conductive contact layer consists of Ni.

2. The optoelectronic semiconductor chip according to claim 1, wherein the electrically conductive mirror layer contains Ag or consists of Ag.

3. The optoelectronic semiconductor chip according to claim 1, wherein the protective layer at least partially fills the interspace and does not project laterally beyond the electrically conductive contact layer.

4. The optoelectronic semiconductor chip according to claim 1, wherein the protective layer is formed of an electrically weakly conductive or insulating material and/or contains one of $SiO_2$ and $Al_2O_3$.

5. The optoelectronic semiconductor chip according to claim 1, wherein a connecting layer formed of a transparent electrically conductive oxide is arranged between the electrically conductive mirror layer and the electrically conductive contact layer.

6. The optoelectronic semiconductor chip according to claim 1, further comprising a further mirror layer arranged on a side of the electrically conductive contact layer facing away from the semiconductor body, wherein the further mirror layer extends laterally beyond the electrically conductive contact layer and covers at least one side surface of the semiconductor body.

7. The optoelectronic semiconductor chip according to claim 6, further comprising at least one contact element for electrically contacting the electrically conductive contact layer, wherein the contact element is arranged in an opening of the further mirror layer.

8. The optoelectronic semiconductor chip according to claim 1, wherein a planarization laterally surrounds the semiconductor body, the electrically conductive mirror layer and the electrically conductive contact layer.

9. The optoelectronic semiconductor chip according to claim 1, wherein the semiconductor body comprises a cross-sectional shape that widens from the first semiconductor region to the second semiconductor region.

10. The optoelectronic semiconductor chip according to claim 1, wherein the second semiconductor region has a connection layer that confines the semiconductor body on its side of the second semiconductor region facing away from the first semiconductor region and comprises a highest doping in the semiconductor body.

* * * * *